United States Patent [19]

Uroshevich

[11] 4,388,481

[45] Jun. 14, 1983

[54] CONCENTRATING PHOTOVOLTAIC SOLAR COLLECTOR

[75] Inventor: Miroslav Uroshevich, Cincinnati, Ohio

[73] Assignee: Alpha Solarco Inc., Cincinnati, Ohio

[21] Appl. No.: 284,649

[22] Filed: Jul. 20, 1981

[51] Int. Cl.³ .............................................. H01L 31/04
[52] U.S. Cl. ..................................... 136/246; 136/259
[58] Field of Search ............................... 136/246, 259

[56] References Cited

U.S. PATENT DOCUMENTS

| | | | |
|---|---|---|---|
| 3,085,565 | 4/1963 | Macauley | 126/451 |
| 4,131,485 | 12/1978 | Meinel et al. | 136/259 |
| 4,166,917 | 9/1979 | Dorfeld | 136/259 |
| 4,177,083 | 12/1979 | Kennedy | 136/259 |
| 4,223,174 | 9/1980 | Moeller | 136/246 |
| 4,242,580 | 12/1980 | Kaplan et al. | 250/203 R |
| 4,248,643 | 2/1981 | Peters | 136/248 |
| 4,253,880 | 3/1981 | Bellugue | 136/259 |
| 4,313,024 | 1/1982 | Horne | 136/253 |

FOREIGN PATENT DOCUMENTS 2607509 9/1977 Fed. Rep. of Germany ...... 136/246

Primary Examiner—Aaron Weisstuch
Attorney, Agent, or Firm—Gary M. Gron

[57] ABSTRACT

The disclosure illustrates a concentrating photovoltaic collector comprising an elongated deep reflector having a rim angle of close to 90° and an elongated series of photovoltaic cells positioned in a plant extending parallel to and spaced beyond the focal axis of the reflector. The cells are mounted in an extrusion that provides a passage for a cell coolant fluid and which has a pair of elongated opposed reflectors inclined toward one another at an angle of 70° with respect to the plane of the photovoltaic cells. The mirrors re-reflect rays to compensate for the shadows cast by the cells and to provide more uniform distribution of solar energy while at the same time permitting a more compact collector.

17 Claims, 3 Drawing Figures

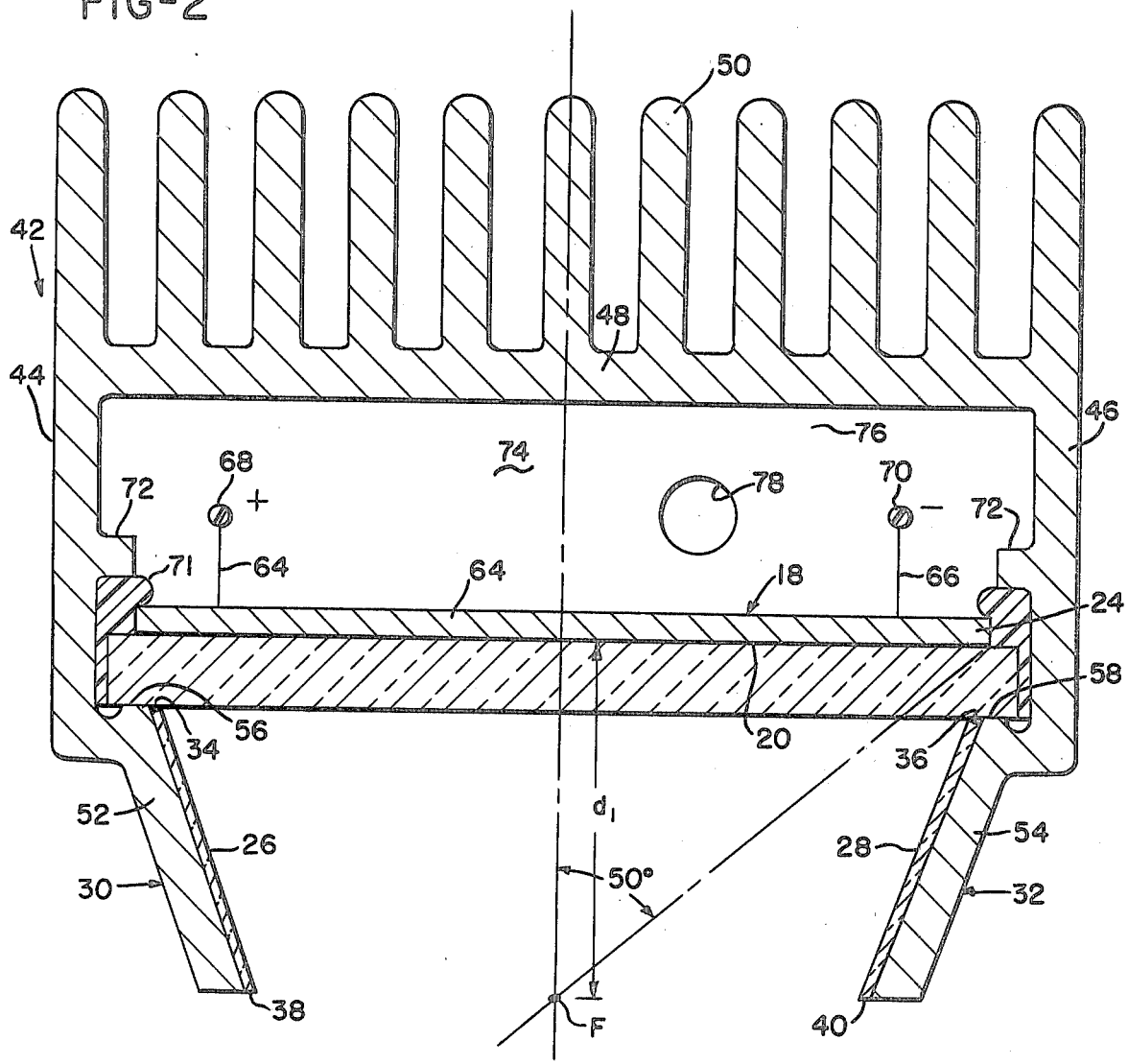
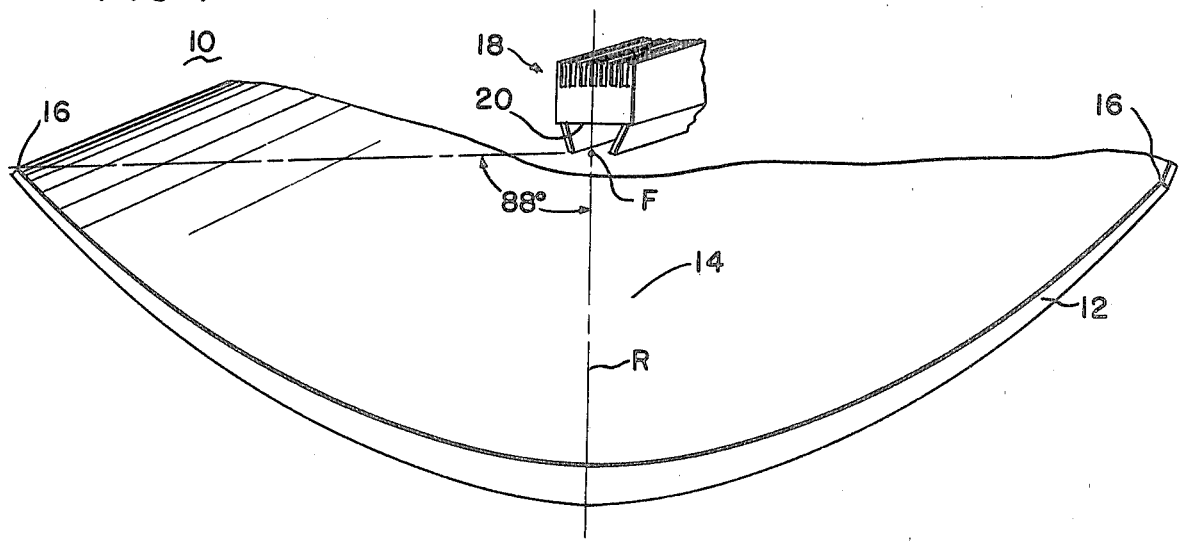

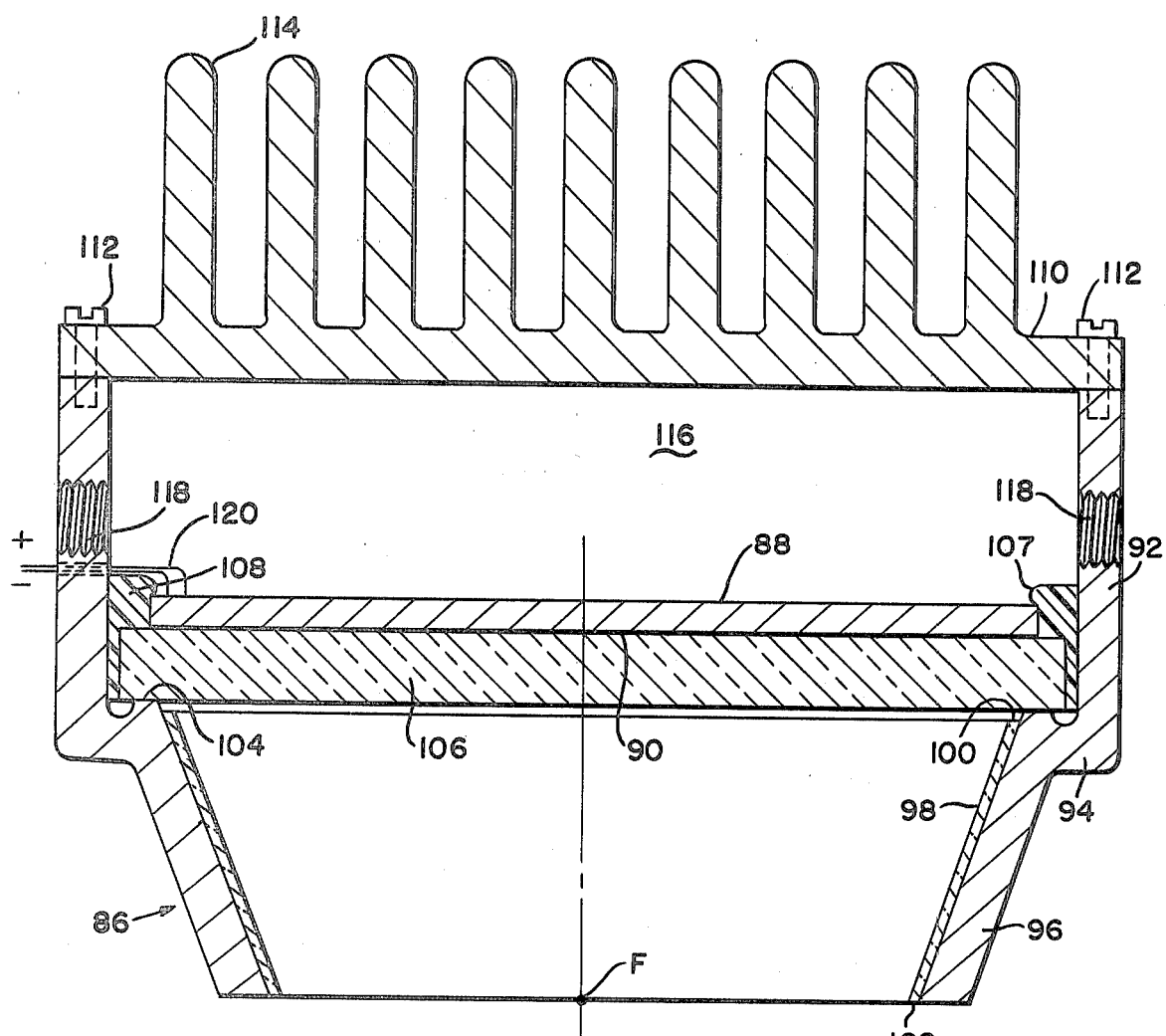
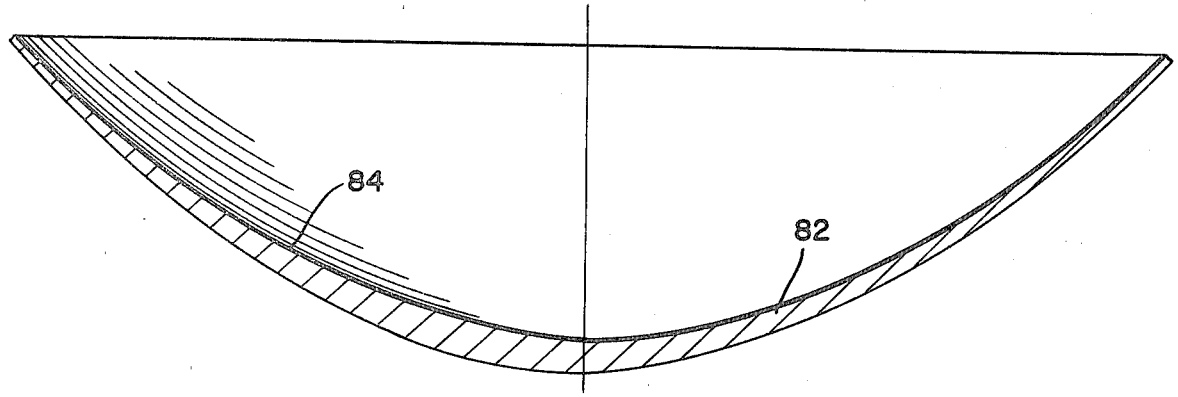
FIG-3

CONCENTRATING PHOTOVOLTAIC SOLAR COLLECTOR

The present invention relates to photovoltaic solar cells and more specifically to the incorporation of such cells in a concentrating collector.

Ever since the first photovoltaic cell was demonstrated by Bell Labs in the early fifties, it has been experimented with as a potential source of electricity. Several problems, however, stand in the way of a successful application of this seemingly inexhaustible source of electricity.

The amount of current that can be generated by such a cell is a direct function of the amount of sunlight striking its surface. Usually, arrays of photovoltaic cells are fixed in an orientation that places their energy receiving surface normal to the sun's rays when it is highest in the sky to provide maximum current output. At other times the output would be much lower because the intensity of the sun is not as great and it strikes the cells at an angle. The obvious way to remedy this somewhat is to constantly re-orient the cells so that they are normal to the sun's rays. In addition, the number of cells can be increased, but this introduces a substantial cost penalty.

A more cost effective way to increase performance is to increase light intensity on a fewer number of cells with a concentrating reflector, especially one that tracks the sun. It has been found that the cost of the reflector and cells is substantially less than the cost of extra cells required to obtain the performance increase. However, still another problem occurs when this type of collector is implemented.

Since photovoltaic cells require a substantially uniform light intensity across their surface it is necessary to use a reflector that has a rather shallow rim angle of about 50°. Although a measure of uniformity is achieved, it is done so at the expense of compactness. The reason for this is that the focus of such a reflector is extremely long thereby forcing a bulky spacial relationship between the reflector and the cells. Furthermore, the cells themselves cast a shadow on the reflector which impairs uniform distribution of light across the cells.

The above problems are solved by a concentrating photovoltaic solar collector which comprises a deep dish reflector symetrical in cross section about a reference line which includes the focus of the reflector. A photovoltaic cell means is positioned along the reference line beyond the focus in an orientation that is normal to the reference line. Reflector means extending from adjacent the cell means toward said reflector have a cross sectional configuration that defines an acute angle with respect to the cell means for re-reflecting solar rays from adjacent the limits of said reflector onto said cell means for uniform solar energy distribution across its surface.

The above and other related features of the present invention will be apparent from a reading of the following description of the disclosure shown in the accompanying drawing and the novelty thereof pointed out in the appended claims.

In the drawings:

FIG. 1 is a simplified perspective view of a concentrating photovoltaic solar collector embodying the present invention.

FIG. 2 is a greatly enlarged cross sectional view of a portion of the collector shown in FIG. 1.

FIG. 3 is a longitudinal section view of a concentrating photovoltaic solar collector employing an alternative embodiment of the present invention.

FIG. 1 shows a collector 10 comprising an elongated main reflector 12 having a concave reflective surface 14 when viewed in cross section. Preferably, the configuration is parabolic, having a focus F to which all the solar rays are reflected. In addition, the cross sectional configuration is symmetric with respect to a reference line R that passes through the focus F and the reflective surface 14. The reflective surface 14 can be characterized as having a deep curvature because its rim or edge 16 is positioned along a ray extending from the focus F that makes almost a 90° angle with respect to the reference line R. Putting it another way, solar rays that are reflected from near the edge 16 of reflector 12 to the focus F make an angle of nearly 90° with respect to the reference line R. In practice the angle is 88°.

An elongated photovoltaic cell device 18 is positioned along the reference line R by arms (not shown) extending to reflector 12 and has a solar energy receiving surface 20 that is in a plane normal to the reference line R. The surface 20 is positioned beyond the focus F of reflector 12 so that the focus F lies between surface 20 and the reflective surface 14. The surface 20 is positioned at a distance d, from the focus F which causes solar rays that have been reflected from a point on surface 14 along a ray extending at an angle of approximately 50° (with respect to the reference line R) to strike directly the edges 22, 24 of the surface 20. Solar rays that have been reflected from a point beyond 50° are re-reflected from the opposing reflective surfaces 26, 28 of mirror assemblies 30, 32, respectively, shown in greater detail in FIG. 2. Surfaces 26, 28 have first edges 34,36 adjacent edges 22,24 respectively of the surface 20. The second edges 38,40 of surfaces 26,28 respectively are positioned closer to one another than the first edges so that the cross section of the reflective surfaces makes an acute angle with respect to the cross section of surface 20. Preferably, the angle is approximately 70°.

The photovoltaic cell device 18 is positioned in a housing 42 having integral side walls 44,46 interconnected by a wall 48 having cooling fins 50. As illustrated, the housing 42 is an elongated extrusion of aluminum and the view shown in the drawing is a cross section of the extrusion. It should be noted that the housing may also be formed from separate segments. Integral support-walls 52,54 for the reflective surfaces 26,28 extend from side walls 44,46 respectively. Shoulders 56,58 at the base of walls 52,54 form elongated supports for an elongated transparent sheet 60.

The photovoltaic cell device 18 comprises a plurality of photovoltaic cells 62 (only one of which is shown) placed edge to edge along transparent sheet 60 so that their solar energy receiving surface 20 is on one face of sheet 60. The cells 62 each have positive and negative leads 64,66 which extend to common electrical output conductors 68,70 in a given electrical interconnection scheme that produces a desired voltage and current output. The cells 62 are mounted in place at their side edges by a setable electrically non-conductive resin 71 that is received between shoulders 56,58 and integral ribs 72.

The side walls 44,46 and interconnecting wall 48 form a channel 74 which, in combination with one side of the photovoltaic cells 62, forms a cooling passage bounded by end walls 76 which have openings 78 for connection with a suitable heat transfer system (not shown) to carry away excessive heat.

The photovoltaic collector of FIGS. 1 and 2 is elongated. FIG. 3 illustrates the application of the present invention to a collector 80 which utilizes a parabolic dish reflector 82 (only a portion of which is shown) that is symmetrical with respect to a reference line R' extending from the surface 84 of reflector 82 through the focal point F. As in the case of FIGS. 1 and 2, the curvature of the surface is deep and rays striking its rim (not shown) are reflected toward the focal point F, at an angle of close to 90° relative to the reference line R.

A photovoltaic cell device 86 is positioned along the reference line R, and has a dishlike photovoltaic cell 88 having an energy receiving circular surface 90 in a plane that is normal to reference line R. Cell 88 is positioned within a cylindrical housing 92 having an integral flange portion 94 from which a frusto conical portion 96 extends to form a secondary reflector. Reflective surface 98, herein illustrated as an aluminized mylar film, is supported by frusto conical portion 96 and assumes the same configuration. When viewed in cross section (FIG. 3) reflective surface 98 has a first edge or rim 100 adjacent surface 90 and a second edge or rim 102 positioned away from surface 90 toward reflector 82. Rim 102 has a smaller diameter than rim 100 so that the cross section of reflective surface 98 is a straight line making an acute angle with respect to surface 90. Preferably this angle is 70°.

A support rim 104 is formed on flange 94 and forms a base for a transparent disc 106 received within housing 92. The surface 90 of the photovoltaic cell 88 abuts transparent disc 106 and a setable, electrically non-conductive resin 108 mounts the cell 88 and disc 106.

A disc-like cap 110 is secured to housing 92 by screws 112 and has a plurality of heat dissipating fins 114. Cap 110 in combination with housing 92 form a chamber 116 for cooling fluid that carries away excess heat from photovoltaic cell 88. To provide circulation of fluid from chamber 116 to an appropriate heat exchange device (not shown) a pair of opposed ports 118 are provided. A pair of leads 120 enable electrical connection of cell 88 to a load or system.

Both embodiments of the invention as described offer the advantage of a substantially uniform distribution of light over the surface of the photovoltaic cells. The shadow which would otherwise be cast by the cell and housing is now eliminated. The rays from the opposing mirrors (when viewed in cross section) overlap adjacent the reference line R to give a light intensity that is approximately equivalent to the light intensity for areas not in the shadow. Furthermore, the opposed reflectors permit a deep curve reflector more commonly used for thermal concentrating collectors. The advantage of this arrangement is that the distance from the focus to the main reflector can be ¼ of the width or diameter of the main reflector instead of over ½ as found in prior art concentrating photovoltaic collectors. This feature of compactness assumes great significance when the collectors are placed in arrays that track the sun. By minimizing this dimension the moveable collectors can be packed closer together.

While several preferred embodiments of the invention have been described, it should be apparent to those skilled in the art that other forms may be practiced without departing from the spirit and scope of the invention.

Having thus described the invention, what is claimed as novel and desired to be secured by Letters Patent of the United States is:

1. A concentrating photovoltaic solar collector comprising:

a reflector having a generally concave cross sectional configuration positionable to receive solar radiation and concentrate it at a focus, said reflector being symetrical with respect to a reference line extending from said focus to said reflector, said reflector further having a sufficiently deep curvature that solar rays striking portions of the reflector farthest from said reference line are reflected to said focus at an angle of close to 90° with respect to said reference line;

photovoltaic cell means positioned along said line so that the energy receiving surface of said cell means is substantially normal to said reference line and facing said reflector, said cell means being positioned so that the focus is between the cell means and the reflector; and, reflector means extending from adjacent said cell means towards said reflector and having a cross sectional configuration generally defining an acute angle with respect to the energy receiving surface of said cell means for re-reflecting solar rays from adjacent the limits of said reflector onto said cell means for uniform solar energy distribution across said surface.

2. Apparatus as in claim 1 wherein;
said reflector is annular and symetrical about said reference line;
said reflector means comprises a generally frusto conical surface having as its base a plane adjacent the solar energy receiving surface of said cell means.

3. Apparatus as in claim 2 wherein said frusto conical surface defines a straight line in cross section, said line making an angle of approximately 70° with respect to said solar energy receiving surface.

4. Apparatus as in claim 1 wherein said reflector means defines a straight line in cross section, said line making an angle of approximately 70° with respect to said solar energy receiving surface.

5. Apparatus as in claim 1 wherein;
said reflector is elongated and has a substantially uniform cross sectional configuration;
said photovoltaic cell means is elongated; and,
said reflector means comprise a pair of elongated reflectors adjacent the side edges of said elongated cell means.

6. Apparatus as in claim 5 wherein said photovoltaic cell means comprises a plurality of photovoltaic cells placed end to end and electrically interconnected.

7. Apparatus as in claim 5 further comprising means for cooling said photovoltaic cell means.

8. Apparatus as in claim 7 wherein said cooling means means for providing a cooling flow of fluid along the face of said cell means that is opposite the energy receiving surface.

9. Apparatus as in claim 8 wherein said cooling flow means comprises an elongated housing in which said elongated photovoltaic cell means is positioned.

10. Apparatus as in claim 9 wherein said reflector means comprises a pair of elongated plates inclined toward one another and having one edge thereof extending adjacent the side edges of said cell means, said plates having a reflective surface on the surfaces opposing one another.

11. Apparatus as in claim 10 wherein said housing and said plates are integral and said housing has elongated opposed grooves along the junction between said housing and plates, said apparatus further comprising a transparent plate positioned in said groove, said transparent plate forming a support for the energy receiving surface of said cell means.

12. Apparatus as in claim 11 wherein said housing has a shoulder formed therein against which the side edge of said cell means abuts for supporting said cell means between said shoulder and said transparent plate.

13. Apparatus as in claim 12 wherein said housing, groove formed therein, and plates have a uniform cross sectional area and are formed from an extrusion.

14. Apparatus as in claim 13 wherein said extrusion is formed from aluminum.

15. Apparatus as in claim 14 wherein said extrusion further comprises a plurality of elongated fins on said housing for dissipating heat.

16. Apparatus as in claim 15 wherein said plate makes an angle of approximately 70° with respect to the plane of the energy receiving surface of said cell.

17. Apparatus as in claim 10 wherein said plates have an aluminized mylar film for forming said reflective surface.

* * * * *